United States Patent
Dietrich et al.

(10) Patent No.: US 11,854,759 B2
(45) Date of Patent: Dec. 26, 2023

(54) ARRANGEMENT OF CONDUCTION-COOLED TRAVELLING WAVE TUBES AND METHOD FOR MANUFACTURING AN ARRANGEMENT

(71) Applicant: Thales Deutschland GmbH Electron Devices, Ulm (DE)

(72) Inventors: Christof Dietrich, Niederstotzingen (DE); Stefan Brunner, Baechingen (DE)

(73) Assignee: Thales Deutschland GmbH Electron Devices, Ulm (DE)

( * ) Notice: Subject to any disclaimer, the term of this patent is extended or adjusted under 35 U.S.C. 154(b) by 473 days.

(21) Appl. No.: 17/271,658

(22) PCT Filed: Aug. 21, 2019

(86) PCT No.: PCT/EP2019/072334
§ 371 (c)(1),
(2) Date: Mar. 11, 2021

(87) PCT Pub. No.: WO2020/043562
PCT Pub. Date: Mar. 5, 2020

(65) Prior Publication Data
US 2021/0335567 A1    Oct. 28, 2021

(30) Foreign Application Priority Data

Aug. 29, 2018    (DE) .................. 10 2018 121 133.3

(51) Int. Cl.
*H01J 23/00*    (2006.01)
*H01J 25/34*    (2006.01)

(52) U.S. Cl.
CPC ............ *H01J 23/005* (2013.01); *H01J 25/34* (2013.01)

(58) Field of Classification Search
None
See application file for complete search history.

(56) References Cited

U.S. PATENT DOCUMENTS

| 5,744,910 | A | 4/1998 | Symons |
| 5,862,462 | A | 1/1999 | Tyner et al. |
| 6,241,193 | B1 | 6/2001 | Cassagne et al. |
| 2005/0077432 | A1 | 4/2005 | Combes et al. |

FOREIGN PATENT DOCUMENTS

| DE | 1123052 B | 2/1962 |
| FR | 2 840 881 A1 | 12/2003 |

OTHER PUBLICATIONS

International Search Report in PCT/EP2019/072334, dated Feb. 11, 2020.

*Primary Examiner* — Thomas J. Hiltunen
(74) *Attorney, Agent, or Firm* — Collard & Roe, P.C.

(57) ABSTRACT

An arrangement of conduction-cooled travelling wave tubes includes multiple travelling wave tubes mounted on a common base, wherein the travelling wave tubes are thermally connected to the base so that during operation of the travelling wave tubes the base forms a heat sink for the travelling wave tubes, and the base is designed to accommodate multiple travelling wave tubes in terms of their dimensions along their beam axes so as to increase the number of travelling wave tubes per surface area unit of the base.

13 Claims, 2 Drawing Sheets

Figure 1:
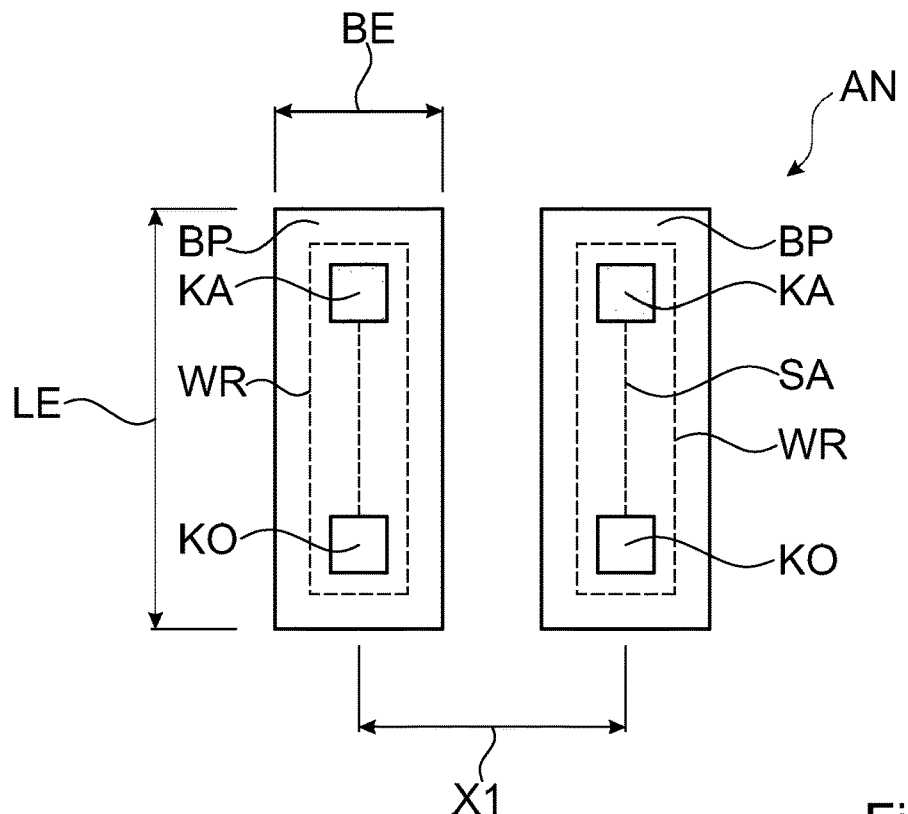

ARRANGEMENT OF CONDUCTION-COOLED TRAVELLING WAVE TUBES AND METHOD FOR MANUFACTURING AN ARRANGEMENT

CROSS REFERENCE TO RELATED APPLICATIONS

This application is the National Stage of PCT/EP2019/072334 filed on Aug. 21, 2019, which claims priority under 35 U.S.C. § 119 of German Application No. 10 2018 121 133.3 filed on Aug. 29, 2018, the disclosure of which is incorporated by reference. The international application under PCT article 21(2) was not published in English.

The invention relates to an arrangement of conduction-cooled traveling-wave tubes as well as to a method for the production of an arrangement.

Traveling-wave tubes (referred to in English as traveling wave tubes) amplify electrical signals, in that free electrons give off part of their motion energy and thereby amplify an electrical signal. Traveling-wave tubes are frequently used for signal amplification in the sector of satellite communications. In space travel and satellite technology, cost pressure is increasingly occurring, and this is countered, above all, by a reduction in the transport costs of satellites. Since the payload that a launch vehicle can convey, for example, is predetermined, an attempt is being made to reduce the transport costs by means of more efficient allocation of the payload. The transport costs of a satellite are based, above all, on its mass and volume, so that savings potentials are being sought with regard to these two variables, in particular.

In the case of traveling-wave tubes, a distinction is made, for categorization, not only according to designs but also according to the selected method of cooling, above all between what are called radiation-cooled tubes and conduction-cooled tubes. Radiation-cooled tubes give off the waste power that occurs during operation as radiation heat, in the form of heat, by way of what are called radiators. In the case of conduction-cooled tubes, the tube that produces the waste power in the form of heat is connected with a thermal sink, in heat-conducting manner.

In the course of satellites becoming smaller and smaller, it is increasingly becoming necessary to increase the packing density, in other words the number of traveling-wave tubes per surface area unit or per volume unit. In this increase of the packing density, the distances between two adjacent traveling-wave tubes are limited downward for conduction-cooled tubes, due to the reciprocal magnetic influence. Frequently, the distance between the beam axes of adjacent tubes is used as a dimension for the packing density of conduction-cooled traveling-wave tubes. The beam axis is the path on which the electrons move in the tube. In the case of conduction-cooled tubes, this distance amounts to between 80 mm, wherein at this distance, reciprocal influence between the tubes prevails, and 100 mm, wherein at this distance no reciprocal influence between the tubes is present. Since the reciprocal magnetic influence is decisive for the distance between the tubes, the distance at which no reciprocal influence comes about can vary in accordance with the power of the traveling-wave tube.

Since amplifier arrangements having greater transmission and reception power are increasingly in demand, but the construction space for such systems is increasingly shrinking, it is the task of this invention to indicate an arrangement of conduction-cooled traveling-wave tubes, as well as a method for the production of arrangements, in which the packing density is increased.

This task is accomplished by means of the independent claims 1 and 13. Further advantageous embodiments of the invention are the object of the dependent claims, in each instance. These can be combined with one another in technologically practical manner. The description, in particular in connection with the drawing, additionally characterizes and specifies the invention.

According to the invention, an arrangement of conduction-cooled traveling-wave tubes, comprising multiple traveling-wave tubes mounted on a common base plate, is indicated, wherein the traveling-wave tubes are thermally connected with the base plate in such a manner that the base plate forms a heat sink with regard to the traveling-wave tubes during operation of the traveling-wave tubes, and this base plate is configured in such a manner that it holds multiple traveling-wave tubes along its beam axes, with regard to its dimensions, so as to increase a number of traveling-wave tubes per surface area unit of the base plate.

The arrangement according to the invention thereby increases the number of traveling-wave tubes per surface area unit of the base plate, in that multiple traveling-wave tubes are arranged on a common base plate. Thereby multiple conduction-cooled traveling-wave tubes share a common base plate, which serves as a heat sink. In this regard, the surface area of the common base plate is less than or at least equal to the sum of the surface areas of individual base plates in the case of arrangements in which one traveling-wave tube is assigned to one base plate, in each instance. In this regard, the traveling-wave tubes are arranged parallel to one another, with reference to their beam axes, on the common base plate. While it is true that in general, other arrangements, for example in T shape or V shape, are also possible, the parallel arrangement has proven to be particularly space-saving.

The reciprocal magnetic influence of adjacent traveling-wave tubes is taken into consideration in the beam focusing of each tube when placing multiple traveling-wave tubes on a common base plate. In this way, disadvantageous effects, which result from a closer arrangement of traveling-wave tubes, can be eliminated or reduced.

A closer arrangement in the sense of this invention is understood to mean that the distance between the beam axes of traveling-wave tubes on the common base plate is less than it would be if the adjacent traveling-wave tubes were each placed on its own base plate. Accordingly, the packing density, in other words the number of tubes per surface area unit of the base plate, is increased.

Within the scope of this application, a base plate is understood to be a plate that is suitable for holding traveling-wave tubes for the purpose of cooling, installation or as a support plate.

According to an embodiment of the invention, the distance between the beam axes of adjacent traveling-wave tubes on the common base plate is less than in the case of placement of traveling-wave tubes each on its own base plate.

Accordingly, the number of traveling-wave tubes per surface area unit of the base plate is increased in that the distance between the beam axes of adjacent traveling-wave tubes is reduced. In particular, the distance between adjacent traveling-wave tubes is less than in the case of arrangements that lie directly next to one another, each consisting of a traveling-wave tube having a base plate, in each instance. As was described in connection with the aforementioned embodiment, the closer arrangement is taken into consideration when setting the magnetic focusing of the electron beam.

According to a further embodiment of the invention, the multiple traveling-wave tubes on the common base plate are supplied by way of a common high-voltage cable.

Since the high-voltage cable also takes up construction space, the construction size of the traveling-wave tube arrangements is also reduced as a result. Likewise, the use of a common high-voltage cable for multiple traveling-wave tubes on the common base plate leads to weight savings.

According to a further embodiment of the invention, the multiple traveling-wave tubes on the common base plate comprise common magnetic shielding.

This magnetic shielding, which magnetically shields the traveling-wave tube arrangements with regard to other components, for example of a satellite, is used for the totality of all the traveling-wave tubes on the common base plate. Aside from savings in construction space, this common magnetic shielding also ensures weight savings. Furthermore, this magnetic shielding for all the traveling-wave tubes jointly has the advantage that a magnetic influence on the traveling-wave tubes caused by other components of the satellite or, in general, of the device in which the traveling-wave tube arrangement is being used, is collectively minimized. Furthermore, the common magnetic shielding can create regions in which an individual traveling-wave tube is arranged, in each instance, so that the tubes are also shielded with regard to one another.

According to a further embodiment of the invention, the distance between beam axes of adjacent traveling-wave tubes on the common base plate amounts to between 100 mm and 40 mm.

With reference to the lower limit of the distance between beam axes of adjacent traveling-wave tubes, the distance of 80 mm, which has been usual until now for conduction-cooled traveling-wave tubes, is cut in half.

As is indicated in a further embodiment of the invention, this leads to an arrangement in which the number of traveling-wave tubes per surface area unit of the base place is increased by a factor of up to two as compared with the placement of traveling-wave tubes each on its own base plate.

Accordingly, at the same surface area of the base plate, either twice as many traveling-wave tubes can be placed, or the traveling-wave tubes take up only half the surface area at a predetermined transmission and reception amplification.

According to two further embodiments of the invention, the traveling-wave tubes are arranged to be parallel or anti-parallel with reference to their beam axes.

Accordingly, an arrangement of multiple traveling-wave tubes on a common base plate is provided, in which the traveling-wave tubes either lie in such a manner that all the collectors and all the cannons of the traveling-wave tubes face in a common direction, in each instance, or in such a manner that in the case of adjacent traveling-wave tubes, collector and cannon lie next to one another, in each instance. In this regard, the cannon is the source of the electrons of the electron beam, wherein the collector is the electron catcher, which is arranged opposite the cannon with reference to the beam axis. Traveling-wave tubes are arranged parallel if the electrons of the beam axis of adjacent tubes run in the same direction. An anti-parallel arrangement consequently exists if the electrons of the electron beam are given off in opposite directions.

According to a further embodiment of the invention, the base plate has a greater height than is usual for base plates for holding an individual traveling-wave tube, in each instance.

Consequently, the common base plate is structured to be larger, with reference to its height, than is usual in the case of arrangements composed of a traveling-wave tube and a base plate. Thereby the greater waste power, in the form of waste heat, caused by the increased number of traveling-wave tubes per base plate, could be countered with a heat sink that has a greater volume. The embodiment of the base plate with a greater height proves to be particularly advantageous if thermal peaks, in other words phases of greater thermal stress, must be compensated. In general, however, the height of the base plate can also be unchanged, in other words remain the same as the height of an individual arrangement composed of a traveling-wave tube and a base plate.

In particular, the base plate is dimensioned in such a manner that it can correspond with a cooling pipe (referred to in English as a Heat-Pipe), and can give heat off to this pipe as effectively as possible.

In the case of the arrangement of multiple traveling-wave tubes per base plate, the total volume of the base plate is at least equal to or less than the composite volume of individual arrangements composed of a base plate and a traveling-wave tube. In the event that the base plate possesses the same volume for the arrangement of multiple traveling-wave tubes as when placing a traveling-wave tube on its own base plate, in each instance, construction space is nevertheless saved, because no free space remains between the traveling-wave tubes.

According to a further embodiment of the invention, a conduction-cooled traveling-wave tube for use in an arrangement having multiple traveling-wave tubes on a common base plate is also indicated, the electron beam focusing of which takes the magnetic interaction of adjacent traveling-wave tubes into consideration, and the components of which, surrounding the beam axis, are reduced with reference to their dimensions, in such a manner that the beam axes of adjacent traveling-wave tubes are spaced closer to one another when placed directly next to one another than in the case of traveling-wave tubes that are provided each on its own base plate, for installation.

Accordingly, a conduction-cooled traveling-wave tube is indicated, the components of which, surrounding the beam axis, such as the installation flange, for example, are reduced with reference to their dimensions. In this regard, the reduction relates to a change in those dimensions that are usual in the case of conduction-cooled traveling-wave tubes having its own base plate. Thereby the radius of the component facing farthest away from one traveling-wave tube to an adjacent tube amounts to around 20 mm, so that the distance of 40 mm between the beam axes of two tubes can be achieved. As a result, it is possible to arrange the traveling-wave tubes closely next to one another with reference to their beam axes. In focusing the electron beam of each traveling-wave tube, it is taken into consideration, according to the invention, that this tube is situated in the region of magnetic influence of an adjacent tube during operation. It is also possible that the components are not reduced symmetrically around the beam axis, but rather are reduced in such a manner that only the structure in the direction of one adjacent tube is reduced, for example.

According to a further embodiment of the invention, a base plate is also indicated, which is suitable, with reference to its dimensions, for holding multiple conduction-cooled traveling-wave tubes, wherein the base plate is thermally connected with the traveling-wave tubes, and the surface area of the base plate is smaller than the total surface area of individual base plates, each having its own conduction-cooled traveling-wave tube.

Accordingly, a base plate is created that is suitable, with reference to its surface area, for holding multiple traveling-wave tubes. As compared with the arrangements usual until now, in which every traveling-wave tube had its own base plate assigned to it, construction space is saved by means of the arrangement of multiple traveling-wave tubes on one base plate. In this regard, the surface area of the base plate when holding multiple conduction-cooled traveling-wave tubes is less than or at least the same as the surface area would be if the traveling-wave tubes would each sit on its own base plate. Even if the total surface area of the base plate for holding multiple tubes is not smaller but merely equal to the total surface area of individual arrangements, each composed of one base plate and one tube, space savings occur, since the free construction space between individual arrangements is being utilized. Also, a larger heat sink is available to an individual tube during alternating operation, in other words if not both tubes are working, and this is another advantage of the arrangement of multiple tubes on a common base plate.

According to the invention, a method for the production of arrangements of multiple conduction-cooled traveling-wave tubes on a common base plate is also indicated, which method provides that first, multiple conduction-cooled traveling-wave tubes are made available, and subsequently, a base plate is made available, which is suitable for holding multiple traveling-wave tubes, and thereupon the traveling-wave tubes are placed on the base plate, so that the traveling-wave tubes and the base plate are in thermal contact, and last, the electron beam focusing of each individual tube under the influence of the other tubes is adjusted.

Accordingly, the method according to the invention provides that multiple traveling-wave tubes are placed on a common base plate, and that the influence of the other tubes is taken into consideration in the electron beam focusing of each individual tube. The influence of the other tubes is, for example, a magnetic transfer or a thermal influence.

Figure 2:
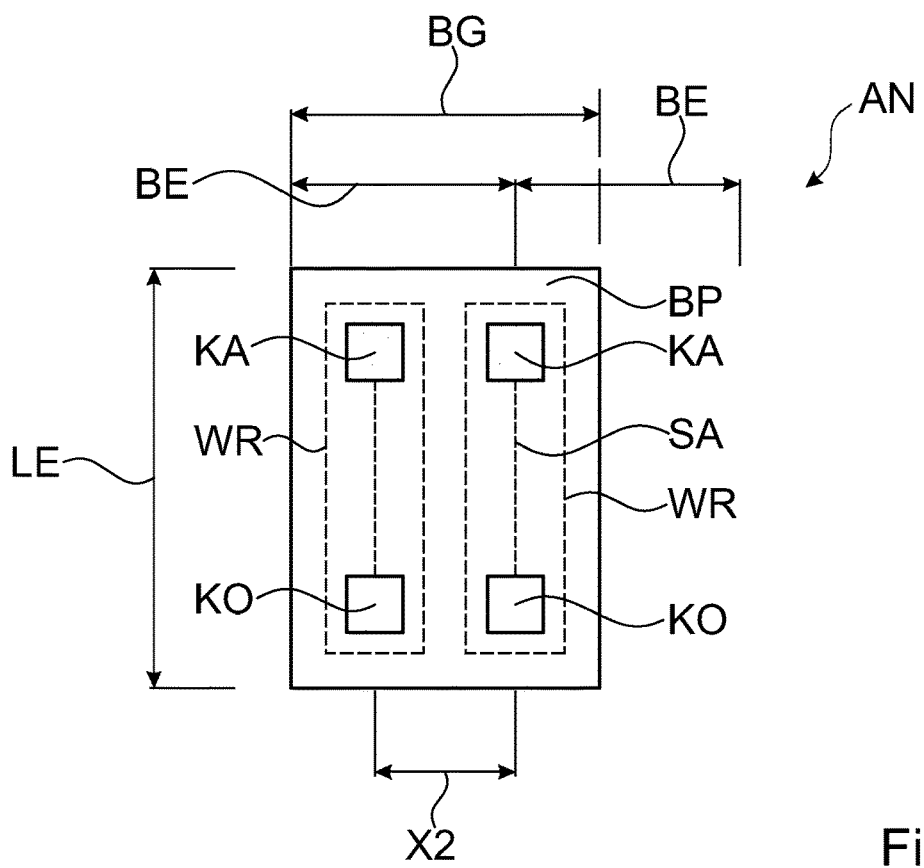
Figure 3:
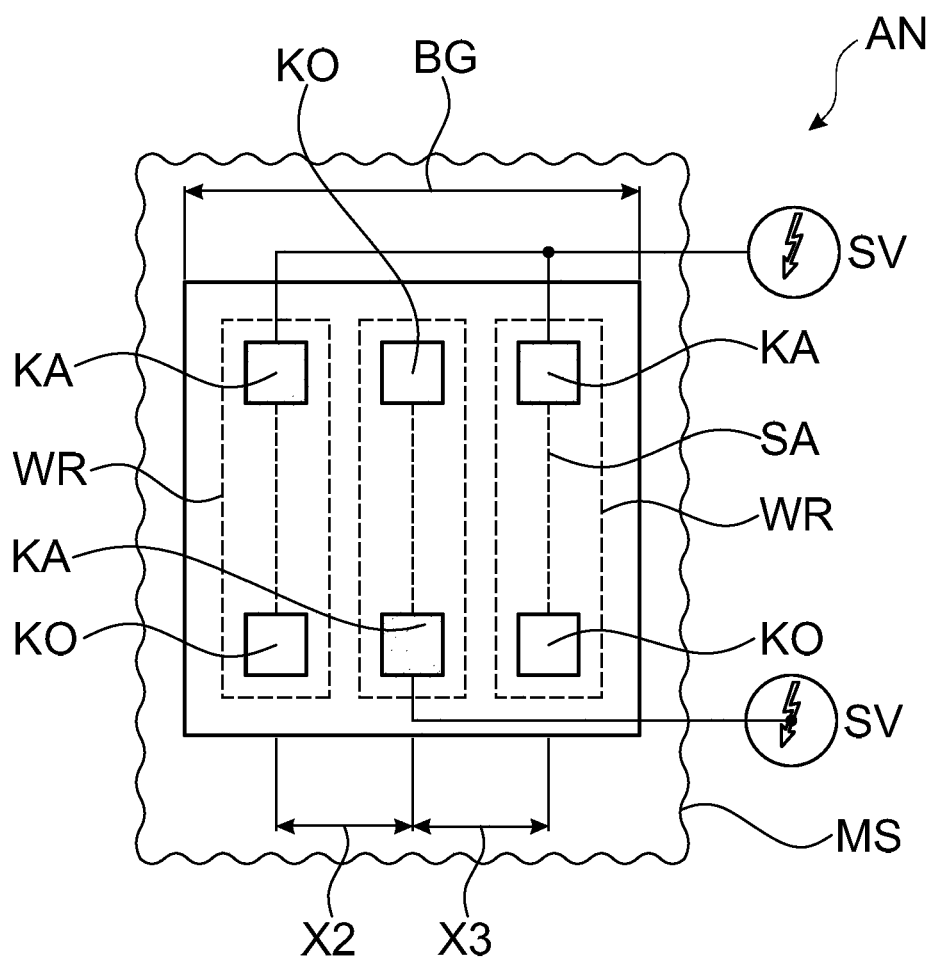

In the following, some exemplary embodiments will be explained in greater detail, using the drawing. This shows:

FIG. 1 a comparison example corresponding to the arrangement of traveling-wave tubes, each on its own base plates;

FIG. 2 an arrangement according to the invention, of multiple traveling-wave tubes on a common base plate; and FIG. 3 a further embodiment of an arrangement according to the invention, of traveling-wave tubes on a common base plate.

In the figures, components that are the same or functionally equivalent have been provided with the same reference symbol.

FIG. 1 schematically shows a comparison example in a top view. What is shown is an arrangement AN of traveling-wave tubes WR, which are shown in the drawing merely using a broken outline. According to FIG. 1, each traveling-wave tube WR is arranged on its own base plate BP, in each instance. In the example shown, the arrangement AN comprises two traveling-wave tubes WR. The traveling-wave tubes each have a cannon KA and a collector KO, between which a beam of electrons runs along a beam axis SA.

An individual base plate possesses the width BE and the length LE, so that the total surface area of the two base plates BP results from twice the product of the length LE and the width BE. In this regard, the surface area of an individual base plate BP is dimensioned in such a manner that the cooling power of the base plate, in its function as a heat sink, is sufficient with regard to the traveling-wave tube WR. A distance X1 between the beam axes SA of the two adjacent traveling-wave tubes WR is shown in FIG. 1. The distance X1 is predominantly predetermined by the magnetic influence of the adjacent traveling-wave tubes WR. If low influence values with regard to the interaction of adjacent traveling-wave tubes WR are acceptable, then the distance usually amounts to 80 mm in the case of conduction-cooled tubes.

In comparison with the comparison example shown in FIG. 1, FIG. 2 shows an arrangement AN according to the invention, of multiple traveling-wave tubes WR on a common base plate BP. Here, too, the traveling-wave tubes WR are merely indicated with their outlines. The dimensions of the common base plate BP are characterized with the width BG and the length LE. As can be seen from the difference of the width BG and the drawn width BE of an individual base plate, the total surface area of the common base plate BP of the arrangement AN is less than the sum of the individual surface areas of individual base plates in the case of individual arrangements of traveling-wave tubes WR.

This surface area savings and thereby the increase in packing density is possible in that a distance X2 between the beam axes SA of adjacent traveling-wave tubes was reduced.

In a comparison of FIG. 1 with FIG. 2, it accordingly holds true that the distance X1 between beam axes of adjacent traveling-wave tubes is greater than the distance X2. A reduction of the construction space and thereby an increase in the packing density furthermore results from the fact that the clear space between adjacent arrangements of traveling-wave tube and base plate shown in FIG. 1 does not have to be created, as shown in FIG. 2. Therefore it could also hold true that the distance X1 is equal to the distance X2. In this case, the savings in surface area would therefore result from the fact that no clear space exists between the separate base plates.

If, however, as shown in FIG. 2, a distance X2 is selected that is less than the distance X1 in FIG. 1, the reciprocal magnetic influence of the traveling-wave tubes must be taken into consideration when setting the magnetic focusing of the electron beam. This process takes place, for example, in that the electron beam focusing of each traveling-wave tube takes place while further traveling-wave tubes are activated. A traveling-wave tube is activated when it is in a state in which it can transmit or receive, in other words it amplifies a signal in each case, and the electron beam that is generated produces a magnetic field that runs around the beam axis SA.

The traveling-wave tubes WR shown in FIG. 2 are arranged parallel adjacent to one another with reference to their beam axes SA. However, an arrangement of the traveling-wave tubes in which the beam axes form an angle relative to one another, could also be implemented. In particular, a V-shaped arrangement, in which the ends of the traveling-wave tubes are spaced farther apart on one side than on the opposite side, is conceivable. It would be possible to nest multiple V-shaped arrangements into one another, so that a traveling-wave tube engages into the open side of an opposite V-shaped arrangement, in each instance. In particular, the distance between the collectors, in other words the region in which a great power loss in the form of heat occurs, can be increased by means of the V-shaped arrangement.

FIG. 3 also shows an arrangement of multiple traveling-wave tubes WR on a common base plate BP. In this regard, the multiple base plates are aligned with one another with reference to their beam axes SA, as shown in FIG. 2, but the beam axis SA of the traveling-wave tube WR that is situated in the middle is arranged anti-parallel to the two traveling-wave tubes that lie on the outside. The two traveling-wave tubes WR that lie on the outside possess a common voltage supply SV, which can be made available, for example, by way of a cable that leads to the cannons KA. In the example of the arrangement AN shown in FIG. 3, the center traveling-wave tube MR possesses its own voltage supply SV.

The distance X2 between the traveling-wave tubes WR is determined from the traveling-wave tube WR that lies in the center to the one that lies on the outside left. The center traveling-wave tube WR has the distance X3 from the traveling-wave tube that lies in the outside right. For example, the traveling-wave tube WR that lies on the outside right in the arrangement shown can be a traveling-wave tube WR having particularly great amplification power, in other words a particularly strong magnetic field. Therefore the distance X3 would be selected to be greater than the distance X2 between traveling-wave tubes WR having a weaker amplification power, as an example. Furthermore, it is shown in FIG. 3 that the arrangement AN, composed of multiple traveling-wave tubes WR on a common base plate BP, comprises a common magnetic shielding MS.

The characteristics indicated above and those indicated in the claims, as well as the characteristics that can be derived from the figures, can advantageously be implemented both individually and in various combinations. The invention is not restricted to the exemplary embodiments described, but rather can be modified in many ways within the scope of the ability of a person skilled in the art.

The invention claimed is:

1. An arrangement (AN) of conduction-cooled traveling-wave tubes (WR), comprising multiple traveling-wave tubes (WR) mounted on a common base plate (BP);
   wherein the traveling-wave tubes (WR) are thermally connected with the base plate (BP) in such a manner that the base plate (BP) forms a heat sink with regard to the traveling-wave tubes (WR) during operation of the traveling-wave tubes (WR);
   wherein the base plate (BP) is configured in such a manner that it holds multiple traveling-wave tubes (WR) along its beam axes (SA), with regard to its dimensions (LE, BG);
   wherein a distance (X2) between the beam axes (SA) of adjacent traveling-wave tubes (WR) is reduced, so as to increase a number of traveling-wave tubes (WR) per surface area unit of the base plate (BP), in such a manner that adjacent traveling-wave tubes (WR) are arranged within their reciprocal magnetic influence; and
   wherein the reciprocal magnetic influence is taken into consideration when adjusting magnetic focusing of the traveling-wave tubes (WR).

2. The arrangement according to claim 1, wherein the distance between the beam axes (X2) of adjacent traveling-wave tubes (WR) on the common base plate (BP) is less than a distance (X1) between the beam axes (SA) of traveling-wave tubes (WR) each placed on its own base plate.

3. The arrangement according to claim 1, wherein the multiple traveling-wave tubes (WR) on a common base plate (BP) are connected with a common high-voltage cable (SV).

4. The arrangement according to claim 1, wherein the multiple traveling-wave tubes (WR) on a common base plate (BP) have a common magnetic shielding.

5. The arrangement according to claim 1, wherein a distance (X2) between beam axes (SA) of adjacent traveling-wave tubes (WR) on the common base plate (BP) amounts to between 100 mm and 40 mm.

6. The arrangement according to claim 1, wherein the number of traveling-wave tubes (WR) per surface area unit of the base plate (BP) is increased by a factor of up to 2 in comparison with traveling-wave tubes (WR) each placed on its own base plate (BP).

7. The arrangement according to claim 1, wherein the traveling-wave tubes (WR) are arranged parallel with reference to their beam axis (SA).

8. The arrangement according to claim 1, in which the traveling-wave tubes (WR) are arranged anti-parallel with reference to their beam axis (SA).

9. The arrangement according to claim 1, wherein the base plate (BP) has a greater height in comparison with a base plate (BP) for holding an individual traveling-wave tube (WR), in each instance.

10. A conduction-cooled traveling-wave tube (WR) for use in the arrangement (AN) according to claim 1, the electron beam focusing of which takes the magnetic interaction of adjacent traveling-wave tubes (WR) into consideration, when these are placed on a common base plate (BP), and the components of which, surrounding the beam axis (SA), are reduced with reference to their dimensions, in such a manner that traveling-wave tubes (WR) arranged next to one another are situated within the magnetic influence of the adjacent traveling-wave tube (WR).

11. A base plate for use in the arrangement (AN) according to claim 1, which is suitable, with reference to its dimensions (LE, BG), for holding multiple conduction-cooled traveling-wave tubes (WR), wherein the base plate (BP) is thermally connected with the traveling-wave tubes (WR), and the surface area of the base plate (BP) is smaller than a total surface area of individual base plates (BP), each having its own conduction-cooled traveling-wave tube (WR), in that a width (BG) of the base plate (BP) is selected in such a manner that the traveling-wave tubes (WR) arranged on the base plate (BP) are situated within their reciprocal magnetic influence.

12. The base plate (BP) according to claim 11, wherein the height of the base plate is greater in comparison to a base plate (BP) for holding a single conduction-cooled traveling-wave tube (WR), in each instance.

13. A method for production of an arrangement of multiple conduction-cooled traveling-wave tubes (WR) on a common base plate (BP), comprising the steps:
   making available multiple conduction-cooled traveling-wave tubes (WR);
   making available a base plate (BP), which is suitable for holding the multiple traveling-wave tubes (WR);
   placing the traveling-wave tubes (WR) on the base plate (BP), so that the traveling-wave tubes (WR) and the base plate (BP) are in thermal contact; and
   adjusting the electron beam focusing of each individual traveling-wave tube (WR) under the influence of the other tubes.

* * * * *